(12) United States Patent
Graef

(10) Patent No.: US 9,356,623 B2
(45) Date of Patent: May 31, 2016

(54) LDPC DECODER VARIABLE NODE UNITS HAVING FEWER ADDER STAGES

(75) Inventor: Nils Graef, Milpitas, CA (US)

(73) Assignee: Avago Technologies General IP (Singapore) PTE. LTD., Singapore (SG)

( * ) Notice: Subject to any disclaimer, the term of this patent is extended or adjusted under 35 U.S.C. 154(b) by 2249 days.

(21) Appl. No.: 12/323,626

(22) Filed: Nov. 26, 2008

(65) Prior Publication Data

US 2010/0131819 A1    May 27, 2010

(51) Int. Cl.
| | |
|---|---|
| *G06F 11/00* | (2006.01) |
| *H03M 13/00* | (2006.01) |
| *H03M 13/11* | (2006.01) |
| *G06F 11/10* | (2006.01) |

(52) U.S. Cl.
CPC ......... *H03M 13/116* (2013.01); *G06F 11/1004* (2013.01); *H03M 13/1117* (2013.01); *H03M 13/1137* (2013.01); *H03M 13/658* (2013.01); *H03M 13/6591* (2013.01)

(58) Field of Classification Search
CPC ............ H03M 13/116; H03M 13/1174; G06F 11/1004; G06F 11/402; G06F 11/3064; G06F 3/0619
USPC .......................................................... 714/780
See application file for complete search history.

(56) References Cited

U.S. PATENT DOCUMENTS

| | | | |
|---|---|---|---|
| 7,178,080 B2 * | 2/2007 | Hocevar ........................ | 714/752 |
| 7,181,676 B2 | 2/2007 | Hocevar | |
| 2005/0193320 A1 | 9/2005 | Varnica et al. | |
| 2005/0204255 A1 | 9/2005 | Yeh et al. | |
| 2005/0283707 A1 | 12/2005 | Sharon et al. | |

(Continued)

FOREIGN PATENT DOCUMENTS

WO    WO 2010/019168 A1    2/2010

OTHER PUBLICATIONS

Kiran Gunnam, Gwan Choi, Mark Yeary—"An LDPC decoding schedule for memory access reduction", IEEE International Conference on Acoustics, Speech, and Signal Processing (ICASSP) 2004, pp. 173-176, vol. 15.

(Continued)

*Primary Examiner* — Shelly A Chase
(74) *Attorney, Agent, or Firm* — Hamilton DeSanctis & Cha

(57) ABSTRACT

In one embodiment, the present invention is a variable node unit (VNU) of a low-density parity-check (LDPC) decoder. The VNU receives a soft-input value and $w_c$ check node messages, where $w_c$ is the column hamming weight of the LDPC code. The VNU generates (i) an extrinsic log-likelihood ratio (LLR) by adding all $w_c$ check node messages together; (ii) a hard-decision output by adding the extrinsic LLR to the soft-input value and selecting the sign bit of the resulting sum; and (iii) $w_c$ variable node messages. Each variable node message is generated by adding a different set of $(w_c-1)$ check node messages to the soft-input value where each set excludes a different check node message. In so doing, VNUs of the present invention may generate variable node messages using fewer adder stages compared to prior-art VNUs such that throughput may be increased over that of prior-art VNUs.

17 Claims, 7 Drawing Sheets

(56) References Cited

U.S. PATENT DOCUMENTS

| | | |
|---|---|---|
| 2006/0107181 A1 | 5/2006 | Dave et al. |
| 2006/0285852 A1 | 12/2006 | Xi et al. |
| 2007/0011569 A1 | 1/2007 | Vila Casado et al. |
| 2007/0011573 A1 | 1/2007 | Farjadrad et al. |
| 2007/0011586 A1 | 1/2007 | Belogolovyi et al. |
| 2007/0044006 A1 | 2/2007 | Yang et al. |
| 2007/0071009 A1 | 3/2007 | Nagaraj et al. |
| 2007/0124652 A1 | 5/2007 | Litsyn et al. |
| 2007/0147481 A1 | 6/2007 | Bottomley et al. |
| 2007/0162788 A1 | 7/2007 | Moelker |
| 2007/0234178 A1 | 10/2007 | Richardson et al. |
| 2007/0234184 A1 | 10/2007 | Richardson |
| 2008/0082868 A1 | 4/2008 | Tran et al. |
| 2008/0104485 A1 | 5/2008 | Lyakh et al. |
| 2008/0109701 A1 | 5/2008 | Yu et al. |
| 2008/0126910 A1 | 5/2008 | Venkatesan et al. |
| 2008/0148129 A1 | 6/2008 | Moon |
| 2008/0163032 A1 | 7/2008 | Lastra-Montano |
| 2008/0235561 A1 | 9/2008 | Yang |
| 2008/0276156 A1 | 11/2008 | Gunnam et al. |
| 2008/0301521 A1 | 12/2008 | Gunnam et al. |
| 2009/0273492 A1 | 11/2009 | Yang et al. |
| 2010/0042806 A1 | 2/2010 | Gunnam |
| 2010/0042890 A1 | 2/2010 | Gunnam |

OTHER PUBLICATIONS

Stefan Landner, Olgica Milenkovic—"Algorithmic and Combinatorial Analysis of Trapping Sets in Structured LDPC Codes", International Conference on Wireless Networks, Communications and Mobile Computing, 2005, pp. 630-635, vol. 1.
Hao Zhong, Tong Zhang—"Block—LDPC: A Practical LDPC Coding System Design Approach", IEEE transactions on circuits and systems—I: Regular Papers, Apr. 2005, pp. 766-775, vol. 52.
Kiran K. Gunnam, Gwan S. Choi, Weihuang Wang, Euncheol Kim, and Mark B. Yeary—"Decoding of Quasi-cyclic LDPC Codes Using an On-the-Fly Computation", Fortieth Asilomar Conference on Signals, Systems and Computers (ACSSC), 2006, pp. 1192-1199.
Thomas J. Richardson and Rudiger L. Urbanke—"Efficient Encoding of Low-Density Parity-Check Codes", IEEE Transactions on Information Theory, Feb. 2001, pp. 638-656, vol. 47, No. 2.
Tom Richardson—"Error Floors of LDPC Codes", IEEE Transactions on Information Theory, Feb. 2001, pp. 1426-1435,vol. 47, No. 2.
E. Papagiannis, C. Tjhai, M. Ahmed, M. Ambroze, M. Tomlinson—"Improved Iterative Decoding for Perpendicular Magnetic Recording", The ISCTA 2005 Conference on Feb. 4, 2005, pp. 1-4.
Kiran K. Gunnam, Gwan S. Choi, and Mark B. Yeary—"A Parallel VLSI Architecture for Layered Decoding for Array LDPC Codes", 20th International Conference on VLSI Design, 2007,6th International Conference on Embedded Systems, Jan. 2007 pp. 738-743.
David J.C. MacKay—"Information Theory, Inference, and Learning Algorithms", Cambridge University Press Sep. 2003, p. 640.
R. Michael Tanner, Deepak Sridhara, Arvind Sridharan, Thomas E. Fuja, and Daniel J. Costello, Jr—"LDPC Block and Convolutional Codes Based on Circulant Matrices", IEEE Transactions on Information Theory, Dec. 2004, pp. 2966-2984, vol. 50, No. 12.
Amin Shokrollahi—"LDPC Codes: An Introduction, In Coding, Cryptography and Combinatorics", Computer Science and Applied Logic, Birkhauser, Basel, 2004, pp. 85-110, vol. 23.
Yang Han and William E. Ryan—"LDPC Decoder Strategies for Achieving Low Error Floors", Proceedings of Information Theory and Applications Workshop, San Diego, CA Jan. 2008, pp. 1-10.
Mohammad M. Mansour and Naresh R. Shanbhag—"Low Power VLSI decoder architectures for LDPC codes", International Symposium on Low Power Electronics and Design Proceedings of the 2002, ICIMS Research Center, 2002, pp. 284-289.
Dale E. Hocevar—"A Reduced Complexity Decoder Architecture Via Layered Decoding of LDPC Codes", IEEE Workshop on Signal Processing Systems, 2004, pp. 107-112.

Robert G. Gallager—"Low Density Parity—Check Codes",Cambridge Mass Jul. 1963,p. 90.
T. Richardson and R. Urbanke—"Modern Coding Theory", Cambridge University Press, Preliminary version—Oct. 18, 2007, p. 590.
Kiran Gunnam, Gwan Choi, Weihuang Wang, Mark Yeary—"Multi-Rate Layered Decoder Architecture for Block LDPC Codes of the IEEE 802, 11n Wireless Standard", IEEE International Symposium on Circuits and Systems (ISCAS) 2007, pp. 1645-1648.
Kiran K. Gunnam, Gwan S. Choi, Mark B. Yeary, Shaohua Yang and Yuanxing Lee—"Next Generation Iterative LDPC Solutions for Magnetic Recording Storage", 42nd Asilomar Conference on Signals, Systems and Computers, 2008, pp. 1148-1152.
D.J.C. MacKay and R.M. Neal—"Near Shannon limit performance of low density parity check codes", Electronics Letters Mar. 13, 1997, pp. 458-459, vol. 33, No. 6.
Jinghu Chen, Ajay Dholakia, Evangelos Eleftheriou, Marc P. C. Fossorier, Xiao-Yu Hu, "Reduced-Complexity Decoding of LDPC Codes", IEEE Transactions on Communications, Aug. 2005, pp. 1288-1299,vol. 53, No. 8.
Kiran K. Gunnam, Gwan S. Choi, Mark B. Yeary and Mohammed Atiquzzaman—"VLSI Architectures for Layered Decoding for Irregular LDPC Codes of WiMax", IEEE International Conference on Communications (ICC), 2007, pp. 4542-4547.
Andrew J. Blanksby and Chris J. Howland—"A 690-mW 1-Gb/s 1024-b, Rate-1/2 Low-Density Parity-Check Code Decoder", IEEE Journal of Solid-State Circuits, Mar. 2002.pp. 404-412,vol. 37, No. 3.
Kiran Gunnam, Weihuang Wang, Gwan Choi, Mark Yeary—"VLSI Architectures for Turbo Decoding Message Passing Using Min-Sum for Rate-Compatible Array LDPC Codes", 2nd International Symposium on Wireless Pervasive Computing (ISWPC), 2007, pp. 561-566.
Kiran K. Gunnam, Gwan S. Choi, Weihuang Wang, and Mark B. Yeary—"A Parallel VLSI Architecture for Layered Decoding",Proceedings of the 20th International Conference on VLSI Design, 6th International Conference: Embedded Systems, 2007, pp. 738-743.
R.Michael Tanner—"A Recursive Approach to Low Complexity Codes",IEEE transaction on Information Theory, Sep. 1981,pp. 533-547,vol. IT-27, No. 5.
Mohammad M. Mansour, and Naresh R. Shanbhag—"A 640-Mb/s 2048-Bit Programmable LDPC Decoder Chip", IEEE Journal of Solid-State Circuits, Mar. 2006, pp. 684-698,vol. 41, No. 3.
Badri N. Vellambi R, and Faramarz Fekri, "An Improved Decoding Algorithm for Low-Density Parity-Check Codes over the Binary Erasure Channel", IEEE Globecom 2005 proceedings, pp. 1182-1186.
Yang Han, William E. Ryan—"Low-Floor Decoders for LDPC Codes", IEEE Transactions on Communications, vol. 57, No. 6, Jun. 2009, pp. 1663-1673.
PCT International Search Report dated Feb. 9, 2009 from International Application No. PCT/US 08/86537.
PCT International Search Report dated May 15, 2009 from International Application No. PCT/US 09/39279.
PCT International Search Report dated Feb. 12, 2009 from International Application No. PCT/US 08/86523.
PCT International Search Report dated May 28, 2009 from International Application No. PCT/US 09/41215.
PCT International Search Report dated May 15, 2009 from International Application No. PCT/US 09/39918.
Cavus et al., "A Performance Improvement and Error Floor Avoidance Technique for Belief Propagation Decoding of LDPC Codes," IEEE 16th International Symposium, Personal, Indoor & Mobile Radio Communications (PIMRC), Berlin, Germany Sep. 11-14, 2005, pp. 2386-2390.
Cavus, Enver et al., "An IS Simulation Technique for Very Low BER Performance Evaluation of LDPC Codes," IEEE International Conference on Communications, Jun. 1, 2006, pp. 1095-1100.
Cole, Chad A. and Hall, Eric K., "Analysis and Design of Moderate Length Regular LDPC Codes with Low Error Floors," Proc, 40th Conf. Information Sciences and Systems, Princeton, NJ, 2006, 6 pgs.
Richardson, Tom, "Error Floors of LDPC Codes," Allerton Conf. on Communication, Control and Computing, (Monticello, Illinois), Oct. 2003, pp. 1426-1435.

(56) References Cited

OTHER PUBLICATIONS

Gunnam, Kiran K., Choi, Gwan S., and Yeary, Mark B., "Technical Note on Iterative LDPC Solutions for Turbo Equalization," Texas A&M Technical Note, Department of ECE, Texas A&M University, College Station, TX 77843, Jul. 2006 (available online at http://dropzone.tamu.edu), pp. 1-5.

Vila Casado, Andres I., Weng, Wen-Yen and Wesel, Richard D. "Multiple Rate Low-Density Parity-Check Codes with Constant Blocklength," IEEE 2004, pp. 2010-2014.

Vila Casado, Andres I. "Variable-rate Low-denisty Parity-check Codes with Constant Blocklength," UCLA Technologies Available for Licensing Copyright © 2009 The Regents of the University of California. http://www.research.ucla.edu/tech/ucla05-074.htm (2 pages).

Vila Casado, Andres I., Weng, Wen-Yen, Valle, Stefano and Wesel, Richard D. "Multiple-Rate Low-Density Parity-Check Codes with Constant Blocklength," IEEE Transactions on Communications, vol. 57, No. 1, Jan. 2009; pp. 75-83.

K. Gunnam et al., "Value-Reuse Properties of Min-Sum for GF(q)" (dated Oct. 2006) Dept. of ECE, Texas A&M University Technical Note, published about Aug. 2010.

K. Gunnam et al., "Value-Reuse Properties of Min-Sum for GF (q)" (dated Jul. 2008) Dept. of ECE, Texas A&M University Technical Note, published about Aug. 2010.

K. Gunnam "Area and Energy Efficient VLSI Architectures for Low-Density Parity-Check Decoders Using an On-The-Fly Computation" dissertation at Texas A&M University, Dec. 2006.

* cited by examiner $$H = \begin{Bmatrix} B_{1,1} & B_{1,2} & B_{1,3} & B_{1,4} & B_{1,5} & B_{1,6} & B_{1,7} & B_{1,8} & B_{1,9} & B_{1,10} \\ B_{2,1} & B_{2,2} & B_{2,3} & B_{2,4} & B_{2,5} & B_{2,6} & B_{2,7} & B_{2,8} & B_{2,9} & B_{2,10} \\ B_{3,1} & B_{3,2} & B_{3,3} & B_{3,4} & B_{3,5} & B_{3,6} & B_{3,7} & B_{3,8} & B_{3,9} & B_{3,10} \\ B_{4,1} & B_{4,2} & B_{4,3} & B_{4,4} & B_{4,5} & B_{4,6} & B_{4,7} & B_{4,8} & B_{4,9} & B_{4,10} \end{Bmatrix} \begin{matrix} \} \\ r=4 \end{matrix}$$

$c = 10$, $\underline{100}$

FIG. 1 (PRIOR ART)

LDPC DECODER VARIABLE NODE UNITS HAVING FEWER ADDER STAGES

BACKGROUND OF THE INVENTION

1. Field of the Invention

The present invention relates to signal processing, and, in particular, to error correction encoding and decoding techniques such as low-density parity-check (LDPC) encoding and decoding.

2. Description of the Related Art

FIG. 1 shows one implementation of a parity-check matrix 100 that may be used to implement a regular, quasi-cyclic (QC) LDPC code. Parity-check matrix 100, commonly referred to as an H-matrix, comprises 40 circulants $B_{j,k}$ that are arranged in r=4 rows of circulants where j=1, . . . , r and c=10 columns of circulants where k=1, . . . , c. A circulant is a sub-matrix that is either equal to an identity matrix or is obtained by cyclically shifting an identity matrix, and a quasi-cyclic LDPC code is an LDPC code in which all of the sub-matrices are circulants. In H-matrix 100, each circulant $B_{j,k}$ is a p×p sub-matrix that may be obtained by circularly shifting a single p×p identity matrix. For purposes of this discussion, assume that p=72 such that H-matrix 100 has p×r=72×4=288 total rows and p×c=72×10=720 total columns. Since each circulant $B_{j,k}$ is a permutation of an identity matrix, the hamming weight (i.e., the number of entries having a value of one) of each column in a circulant and the hamming weight of each row in a circulant are both equal to 1. Thus, the total hamming weight $w_r$ for each row of H-matrix 100 is equal to 1×c=1×10=10, and the total hamming weight $w_c$ for each column of H-matrix 100 is equal to 1×r=1×4=4. Each of the 288 rows of H-matrix 100 corresponds to an $m^{th}$ check node, where m ranges from 1, . . . , 288, and each of the 720 columns corresponds to an $n^{th}$ variable node (also referred to as a bit node), where n ranges from 1, . . . , 720. Further, each check node is connected to $w_r=10$ variable nodes as indicated by the 1s in a row, and each variable node is connected to $w_c=4$ check nodes as indicated by the 1s in a column. H-matrix 100 may be described as a regular LDPC code since all rows of H-matrix 100 have the same hamming weight $w_r$ and all columns of H-matrix 100 have the same hamming weight $w_c$.

FIG. 2 shows a simplified block diagram of one implementation of a prior-art LDPC decoder 200 that may be used to decode a signal encoded using an H-matrix such as H-matrix 100 of FIG. 1. LDPC decoder 200 receives 720 soft values (e.g., log-likelihood ratios) from a soft detector such as a soft-output Viterbi detector and stores these soft values in soft-value memory 202. Each soft value corresponds to one bit of a received LDPC-encoded codeword. The encoded codeword is decoded iteratively using a belief propagation technique, where each iteration is performed in a number of clock cycles that is equal to the number c of circulant columns (e.g., 10 clock cycles/iteration for H-matrix 100).

During the first clock cycle of the initial iteration, soft-value memory 202 provides the first 72 of 720 soft values in parallel to 72 variable node units (VNUs) 204(0), . . . , (71), such that each soft value is provided to a different VNU 204. VNUs 204(0), . . . , (71) perform variable node updates for the first 72 columns of H-matrix 100 (i.e., for the first circulant column comprising circulants $B_{1,1}$, $B_{2,1}$, $B_{3,1}$, and $B_{4,1}$). Specifically, each VNU 204 generates one variable node message for each of the four circulants $B_{1,1}$, $B_{2,1}$, $B_{3,1}$, and $B_{4,1}$ (e.g., one message for each column entry having a value of 1 implies four messages per column), such that the total number of variable node messages generated by VNUs 204(0), . . . , (71) is equal to 4×72=288. During the initial iteration (i.e., i=0), each variable node message may be generated per Equation (1) as follows:

$$Q_{nm}^{(0)} = L_n^{(0)}, \text{ where} \qquad (1)$$

$Q_{nm}^{(0)}$ is the variable node message provided from the $n^{th}$ variable node to the $m^{th}$ check node for the $0^{th}$ iteration and $L_n^{(0)}$ is the initial soft value received from soft-value memory 202 that corresponds to the $n^{th}$ variable node. The operation of VNUs 204(0), . . . , (71) is discussed in further detail below in relation to FIG. 3.

VNUs 204(0), . . . , (71) provide the 4×72 variable node messages (herein referred to as Q messages) that they generate to four 72-way barrel shifters 206(0), . . . , (3). In particular, the 72 Q messages generated in relation to circulant $B_{1,1}$, the 72 Q messages generated in relation to circulant $B_{2,1}$, the 72 Q messages generated in relation to circulant $B_{3,1}$, and the 72 Q messages generated in relation to circulant $B_{4,1}$ are provided to separate barrel shifters 206(0), . . . , (3), respectively. Barrel shifters 206(0), . . . , (3) cyclically shift the Q messages that they receive based on cyclic-shift factors that (i) correspond to the cyclic shifts of circulants $B_{1,1}$, $B_{2,1}$, $B_{3,1}$, and $B_{4,1}$ of H-matrix 100 of FIG. 1 and (ii) may be received from, for example, controller 214. The four barrel shifters 206 then provide 4×72 cyclically shifted Q messages to 4×72 check node units (CNUs) 208(0), . . . , (287), such that each CNU 208 receives a different one of the Q messages.

During the second clock cycle of the first iteration, VNUs 204(0), . . . , (71) receive the second 72 of 720 soft values from soft-value memory 202. VNUs 204(0), . . . , (71) perform variable node updates for the second 72 columns of H-matrix 100 (i.e., for the second circulant column comprising circulants $B_{1,2}$, $B_{2,2}$, $B_{3,2}$, and $B_{4,2}$) in a manner similar to that described above in relation to the first clock cycle (e.g., using Equation (1)) and provide 4×72 Q messages to barrel shifters 206(0), . . . , (3). Barrel shifters 206(0), . . . , (3) cyclically shift the 4×72 Q messages according to the cyclic shifts of circulants $B_{1,2}$, $B_{2,2}$, $B_{3,2}$, and $B_{4,2}$ of H-matrix 100 of FIG. 1 and provide 4×72 cyclically shifted Q messages to check node units (CNUs) 208(0), . . . , (287). Note that, cyclic shifting of the 4×72 Q messages is performed such that each Q message is distributed to the same CNU as the Q message from the prior clock cycle that corresponds to the same row (i.e., the same check node) of H-matrix 100. This process is repeated for the remaining eight circulant columns during the remaining eight clock cycles of the iteration.

Referring now to CNUs 208(0), . . . , (287), during the first iteration (i.e., the first 10 clock cycles), each of the CNUs receives a number of Q messages equal to the hamming weight $w_r$ of a row of H-matrix 100 (e.g., 10) and generates $w_r$ check node messages. Each check node message may be calculated using a min-sum algorithm, characterized by Equations (2), (3), and (4) shown below:

$$R_{mn}^{(i)} = \delta_{mn}^{(i)} \kappa_{mn}^{(i)} \qquad (2)$$

$$\kappa_{mn}^{(i)} = |R_{mn}^{(i)}| = \min_{n' \in N(m)/n} |Q_{n'm}^{(i-1)}| \qquad (3)$$

$$\delta_{mn}^{(i)} = \left( \prod_{n' \in N(m)/n} \text{sign}(Q_{n'm}^{(i-1)}) \right), \qquad (4)$$

where $R_{mn}^{(i)}$ represents the check node message (herein referred to as the R message) from the $m^{th}$ check node to the $n^{th}$ variable node for the $i^{th}$ iteration. Suppose that n' is a variable node in the set N(m)/n of all variable nodes connected to the $m^{th}$ check node except for the $n^{th}$ variable node (i.e., n' ∈ N(m)/n). The $m^{th}$ check node generates message $R_{mn}^{(i)}$ based on all Q messages received during the previous $(i-1)^{th}$ iteration from the set N(m)/n. Thus, in the embodiment of FIG. 2, each R message is generated based on nine Q messages (i.e., $w_r-1=10-1$).

Message $R_{mn}^{(i)}$ may be calculated in several steps. First, the $m^{th}$ check node generates a sign $\delta_{mn}^{(i)}$ for message $R_{mn}^{(i)}$ by taking the product of the signs of the Q messages in set n' as shown in Equation (4). This can also be performed using binary addition, such as a modulo 2 operation, of the signs rather than multiplication. Next, the $m^{th}$ check node generates a magnitude $|R_{mn}^{(i)}|$ for message $R_{mn}^{(i)}$ by determining the minimum magnitude of the Q messages in set N(m)/n as shown in Equation (3). Then, the $m^{th}$ check node multiplies sign $\delta_{mn}^{(i)}$ by magnitude $|R_{mn}^{(i)}|$ as shown in Equation (2). Note that, other variations of the min-sum algorithm are possible such as an offset min-sum algorithm and a normalized min-sum algorithm. Further, CNU algorithms other than the min-sum algorithm, such as the sum product algorithm, may be used.

The min-sum algorithm described in Equations (2), (3), and (4) may be simplified using a value-reuse technique. For example, consider that, during an iteration, each CNU 208 receives ten Q messages and generates ten R messages. Each R message is generated using a set of N(m)/n=9 Q messages (one message is excluded as described above). For nine of these R messages, the minimum magnitude of the Q messages generated using Equation (3) will be the same. For one of these R messages, the minimum magnitude of the Q messages will be the second smallest magnitude of the Q messages because the minimum magnitude of the Q messages will be excluded from the calculation as described above. Thus, it is not necessary to perform Equation (3) ten times for each CNU. Rather, each CNU may receive its corresponding ten Q messages during an iteration, store the two Q messages with the smallest magnitude, and store an index value corresponding to the minimum magnitude. The index value may be used to match the second smallest magnitude with the correct R message.

Referring back to FIG. 2, the min-sum algorithm performed by CNUs 208(0), ..., (287) may be a two-step process performed over two iterations. For example, during the $i^{th}$ iteration (i.e., 10 clock cycles), each CNU 208 receives and processes ten Q messages. These messages may be processed by (1) determining the minimum and second minimum values, (2) summing the signs of the ten Q messages, and (3) providing the signs of the ten Q messages sequentially to FIFO 210. Each CNU 208 does not begin outputting the ten R messages it generates until the $(i+1)^{th}$ iteration (i.e., after it has received all ten Q messages). During the $(i+1)^{th}$ iteration, each CNU 208 may receive ten new Q messages at a rate of one per clock cycle and may output the ten R messages at a rate of one per clock cycle. Upon being output, each R message is multiplied by a different sign value $\delta_{mn}^{(i)}$ that may be obtained by adding (i) the sum of the signs of the ten Q messages and (ii) a sign received from FIFO 210 that corresponds to message $Q_{mn}^{(i-1)}$. In so doing, one sign of the Q messages is excluded from sign value $\delta_{mn}^{(i)}$ as shown in Equation (4) (i.e., sign $\delta_{mn}^{(i)}$ is generated based on the signs of nine Q messages rather than ten).

During each clock cycle, each barrel shifter 212 receives 72 R messages in parallel and cyclically shifts the R messages according to the cyclic shifts of the circulants $B_{j,k}$ of H-matrix 100 of FIG. 1, which may be provided by controller 214. Essentially, barrel shifters 212(0), ..., (3) reverse the cyclic shifting of barrel shifters 206(0), ..., (3). Barrel shifters 212(0), ..., (3) then provide the 4×72 cyclically shifted R messages to VNUs 204(0), ..., (71), such that each VNU 204 receives four of the R messages.

During the second iteration, each VNU 204 updates each of the four Q messages that it generates as shown in Equation (5):

$$Q_{nm}^{(i)} = L_n^{(0)} + \sum_{m' \in M(n)/m} R_{m'n}^{(i-1)}, \tag{5}$$

where m' is a check node in the set M(n)/m of all check nodes connected to the $n^{th}$ variable node except the $m^{th}$ check node (i.e., m' ∈ M(n)/m). The $n^{th}$ variable node generates message $Q_{mn}^{(i)}$ based on (i) all R messages received during the previous $(i-1)^{th}$ iteration from the set M(n)/m and (ii) the initial soft value $L_n^{(0)}$ received from soft value memory 202 that corresponds to the $n^{th}$ variable node.

In addition to outputting four updated Q messages, each VNU 204 outputs both (i) a soft value (i.e., an extrinsic LLR) and (ii) a hard-decision bit for each variable node. Each extrinsic LLR value may be represented as shown in Equation (6):

$$\text{Extrinsic Value}_n = \sum_{m \in M(n)} R_{mn}^{(i)}, \tag{6}$$

where m is a check node in the set M(n) of all check nodes connected to the $n^{th}$ variable node (i.e., m ∈ M(n)). Each hard-decision bit $\hat{x}_n$ may be generated based on Equations (7), (8), and (9) below:

$$P_n = L_n^{(0)} + \sum_{m \in M(n)} R_{mn}^{(i)} \tag{7}$$

$$\hat{x}_n = 0 \text{ if } P_n \geq 0 \tag{8}$$

$$\hat{x}_n = 1 \text{ if } P_n < 0 \tag{9}$$

$P_n$ is determined for each variable node by adding the extrinsic value from Equation (6) to the initial soft value $L_n^{(0)}$ received from soft-value memory 202 that corresponds to the $n^{th}$ variable node. If $P_n$ is greater than or equal to zero, then the hard-decision bit $\hat{x}_n$ is set equal to zero as shown in Equation (8). If $P_n$ is less than zero, then the hard-decision bit $\hat{x}_n$ is set equal to one as shown in Equation (9).

A parity check is then performed using the hard-decision values. If $\hat{x}H^T=0$, where $H^T$ is the transpose of H-matrix 100 of FIG. 1, then the decoding process is finished. If $\hat{x}H^T \neq 0$, then a subsequent iteration is performed to generate a new set of extrinsic LLR values and hard decisions. If the decoding process does not end within a predefined number of iterations, then the decoding process is terminated and the received codeword has not been properly decoded.

FIG. 3 shows a simplified block diagram of one implementation of a prior-art VNU 300 that may be used to implement each VNU 204 of FIG. 2. During each iteration, except for the initial iteration, VNU 300 (i) receives four R messages $R_1, R_2, R_3$, and $R_4$ and a soft value and (ii) generates four Q messages $Q_1, Q_2, Q_3, Q_4$ using Equation (5); a hard-decision output value $\hat{x}_n$ using Equations (7), (8), and (9); and an extrinsic LLR value using Equation (6). The soft value, the R messages, the Q messages, and the extrinsic LLR value may each be represented using a number b of bits that may vary from one implementation to the next, while the hard output value $\hat{x}_n$ is typically represented using one bit.

R messages $R_1$, $R_2$, $R_3$, and $R_4$ are converted from sign-magnitude format to two's-complement format using sign-magnitude-to-two's-complement (S2T) converters 302(0), ..., (3), respectively. The four converted R messages are added together to generate the extrinsic LLR value as shown in Equation (6) using two adder stages. The first adder stage comprises (i) adder 304(0), which adds messages $R_1$ and $R_2$ (i.e., $R_1+R_2$), and (ii) adder 304(1), which adds messages $R_3$ and $R_4$ (i.e., $R_3+R_4$). The second adder stage comprises adder 306, which adds (i) the sum of messages $R_1$ and $R_2$ to (ii) the sum of messages $R_3$ and $R_4$ to generate the extrinsic LLR (i.e., $R_1+R_2+R_3+R_4$). The extrinsic LLR may be normalized and truncated (i.e., 308) as discussed in further detail below. The normalized, truncated extrinsic LLR value may then be saturated (e.g., SAT 312) and output from VNU 300. Saturation may be performed such that the normalized, truncated extrinsic value is maintained within a specified range. For example, if a range of ±15 is specified, a normalized, truncated extrinsic LLR value greater than +15 may be mapped to +15 and a normalized, truncated extrinsic LLR value less than −15 may be mapped to −15.

The normalized, truncated extrinsic LLR value is also used to generate a hard-decision output value $\hat{x}_n$. In particular, the normalized, truncated extrinsic LLR value is provided to a third adder stage that comprises adder 310. Adder 310 generates a value P as shown in Equation (7) by adding the normalized, truncated extrinsic LLR value to the soft value (i.e., $P=R_1+R_2+R_3+R_4+\text{soft value}$). The sign bit of P is then used to generate the hard-decision value $\hat{x}_n$. When using two's complement format, the most significant bit (MSB) (i.e., the bit furthest to the left) of a b-bit binary number is the sign bit of the binary number. If the sign bit is 0, then the binary number is ≥0, and if the sign bit is 1, then the binary number is <0. Thus, if the sign bit of P is 0, then P≥0 and the hard-decision value is 0 as shown in Equation (8). If the sign bit of P is 1, then P<0 and the hard-decision value is 1 as shown in Equation (9). The hard-decision value $\hat{x}_n$ may be determined without any additional hardware, for example, by outputting only the MSB and dropping all other bits from P.

Referring back to S2T converters 302(0), ..., (3), converted messages $R_1$, $R_2$, $R_3$, and $R_4$ are normalized and truncated (i.e., 314(0), ..., (3)) and provided to a fourth adder stage comprising adders 316(0), ..., (3), such that each normalized, truncated R message is provided to a different adder 316. Each adder 316 generates a Q message as shown in Equation (5) based on (i) the R message that it receives and (ii) the value P generated by adder 310. In particular, message $Q_1$ is generated by subtracting message $R_1$ from P (i.e., $Q_1=R_1+R_2+R_3+R_4+\text{soft value}-R_1$), message $Q_2$ is generated by subtracting message $R_2$ from P (i.e., $Q_2=R_1+R_2+R_3+R_4+\text{soft value}-R_2$), message $Q_3$ is generated by subtracting message $R_3$ from P (i.e., $Q_3=R_1+R_2+R_3+R_4+\text{soft value}-R_3$), and message $Q_4$ is generated by subtracting message $R_4$ from P (i.e., $Q_4=R_1+R_2+R_3+R_4+\text{soft value}-R_4$). Messages $Q_1$, $Q_2$, $Q_3$, and $Q_4$ may then be saturated (e.g., SAT 318(0), ..., (3)) in a manner similar to that described above in relation to SAT 312, converted from two's-complement format to sign-magnitude format (e.g., T2S 320(0), ..., (3)), and output to downstream processing such as barrel shifters 206(0), ..., (3) of FIG. 2.

In adding the R messages together, the sum of the R messages may grow relatively large, such that more than b bits may be needed to represent the generated Q messages. Normalization and truncation (i.e., 308 and 314(0), ..., (3)) is employed to ensure that the number b of bits used to represent the R messages and Q messages remains constant. Normalization may be applied, for example, by dividing the sum and each of the four R messages by a factor of two. Truncation may be applied, for example, by deleting the least significant bit (LSB). Further, both normalization and truncation may be applied using no additional hardware. Normalization may be applied using connections that shift the bit values of the sum or R message. Truncation may be applied by removing the connection that corresponds to the LSB. As an example, suppose that b=4 bits and that adder 306 adds 1000 (i.e., −8 in decimal format) and 1000. The resulting sum, 10000 (i.e., −16 in decimal form), may be normalized (e.g., divided by two) by shifting 10000, such that the normalized sum is 1000.0 (i.e., −16/2=−8 in decimal form). The normalized sum 1000.0 may then be truncated to arrive at the 4-bit number 1000.

SUMMARY OF THE INVENTION

In one embodiment, the present invention is a method for generating a plurality of variable node messages in a low-density parity-check (LDPC) decoder having at least one variable node unit (VNU). A set of three or more check node messages are received, and the plurality of variable node messages are generated by summing a different subset of the check node messages. Each different subset of the check node messages excludes a different check node message, and each variable node message is generated without subtracting the corresponding different check node message from a value corresponding to a sum of all of the check node messages.

In another embodiment, the present invention is an LDPC decoder having at least one VNU. The VNU comprises a plurality of adder stages adapted to (i) receive a set of three or more check node messages and (ii) generate each of a plurality of variable node messages by summing a different subset of the check node messages. Each different subset of the check node messages excludes a different check node message, and the VNU is adapted to generate each variable node message without subtracting the corresponding different check node message from a value corresponding to a sum of all of the check node messages.

In yet another embodiment, the present invention is an LDPC decoder having at least one VNU. The VNU comprises (i) a means for receiving a set of three or more check node messages and (ii) a means for generating each of a plurality of variable node messages by summing a different subset of the check node messages. Each different subset of the check node messages excludes a different check node message, and each variable node message is generated without subtracting the corresponding different check node message from a value corresponding to a sum of all of the check node messages.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

FIG. 1 shows one implementation of a parity-check matrix that may be used to implement a regular, quasi-cyclic (QC) low-density parity-check (LDPC) code;

DETAILED DESCRIPTION

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

Figure 3:
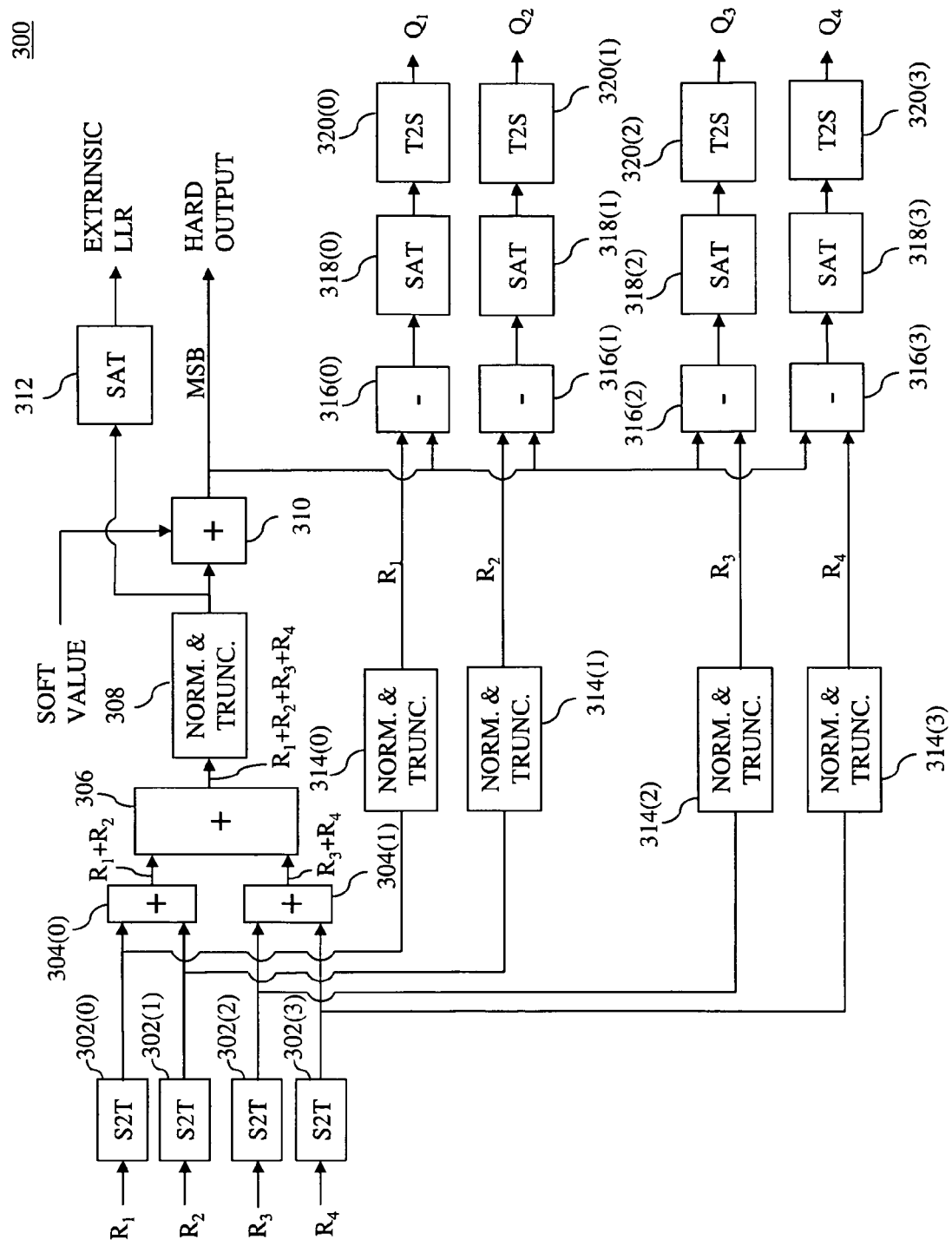
FIG. 3 shows a simplified block diagram of one implementation of a prior-art variable node unit (VNU) that may be used to implement each VNU of FIG. 2.
Figure 4:
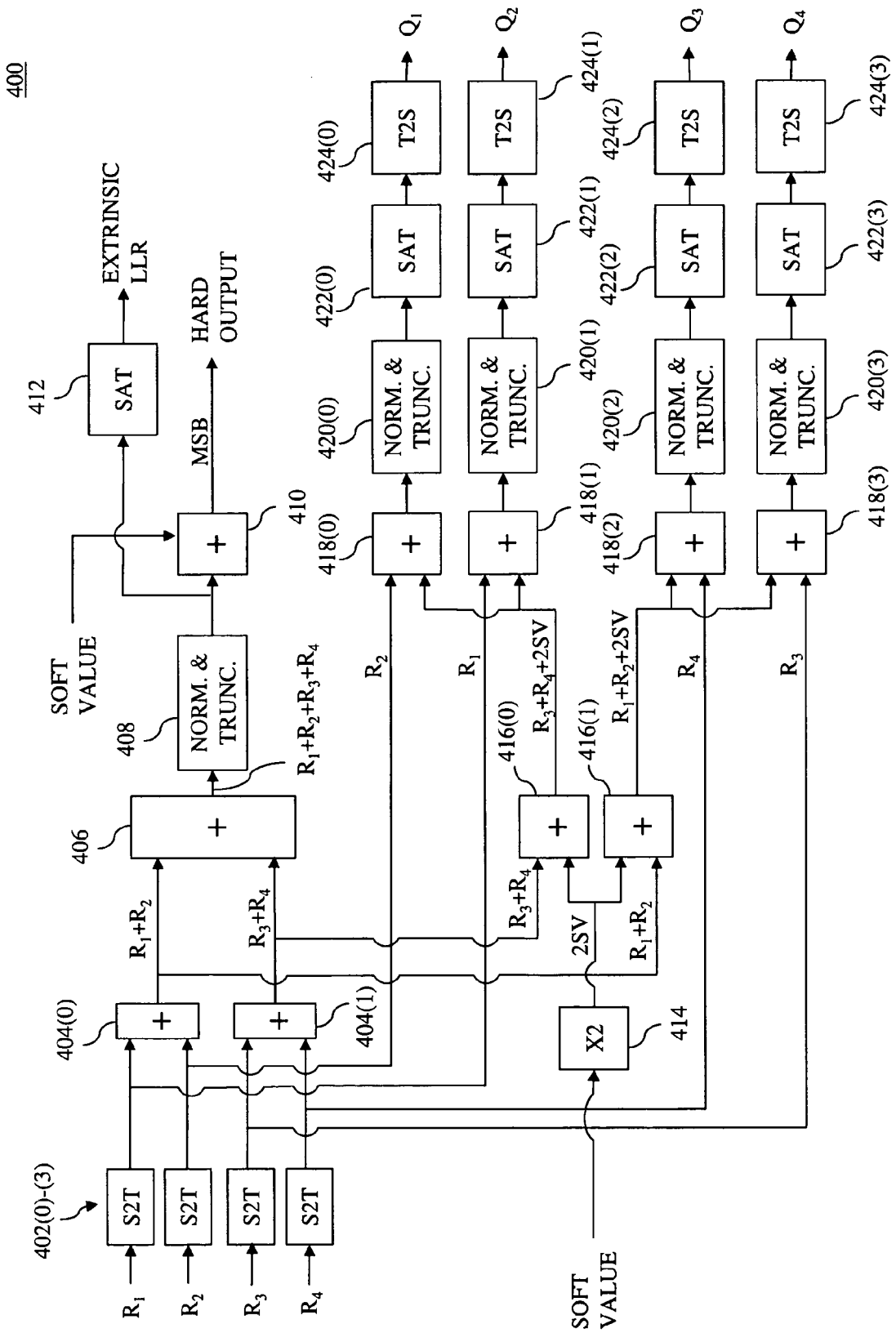
FIG. 4 shows a simplified block diagram of a VNU according to one embodiment of the present invention.

FIG. 4 shows a simplified block diagram of a variable node unit (VNU) 400 according to one embodiment of the present invention. VNU 400, which supports LDPC codes having column hamming weights $w_c$ equal to four, may be used to implement VNUs in a wide range of LDPC decoder configurations, including the LDPC decoder configuration of FIG. 2. Similar to VNU 300 of FIG. 3, during each iteration, except for the initial iteration, VNU 400 (i) receives four R messages $R_1$, $R_2$, $R_3$, and $R_4$ and a soft value and (ii) generates four Q messages $Q_1$, $Q_2$, $Q_3$, $Q_4$, a hard-decision output $\hat{x}_n$, and an extrinsic LLR value. However, rather than generating the Q messages by adding all of the R messages together and subtracting R messages from the total, as is done by VNU 300, VNU 400 generates each Q message by adding only the R messages that are needed to generate the Q message. In so doing, VNU 400 may generate the Q messages using three adder stages. The first adder stage comprises adders 404(0) and 404(1), the second adder stage comprises adders 406, 416(0), and 416(1), and the third adder stage comprises adders 418(0), . . . , (3) and 410. This is in contrast to VNU 300, which uses four adder stages to generate the Q messages. By using fewer adder stages, VNU 400 may generate the four Q messages in a shorter amount of time than VNU 300. As a result, the throughput of VNU 400 may be greater than the throughput of VNU 300. Typically, the overall throughput of LDPC decoders is limited by the throughput of the VNU'S. Since the throughput of VNU 400 may be greater than the throughput of VNU 300, the overall throughput of LDPC decoders implemented using VNU 400 may be greater than that of comparable LDPC decoders implemented using VNU 300.

Messages $R_1$, $R_2$, $R_3$, and $R_4$ are converted from sign-magnitude format to two's-complement format using sign-magnitude-to-two's-complement (S2T) converters 402(0), . . . , (3), respectively. The four converted R messages are added together using adders 404(0), 404(1), and 406 to generate the extrinsic LLR value as shown in Equation (6). In particular, adder 404(0) adds messages $R_1$ and $R_2$ (i.e., $R_1+R_2$), adder 404(1) adds messages $R_3$ and $R_4$ (i.e., $R_3+R_4$), and adder 406 adds (i) the sum of messages $R_1$ and $R_2$ to (ii) the sum of messages $R_3$ and $R_4$ to generate the extrinsic LLR value (i.e., $R_1+R_2+R_3+R_4$). The extrinsic LLR value may be normalized and truncated (i.e., 408) and saturated (SAT) (i.e., 412) in a manner similar to that described above in relation to the analogous elements of VNU 300 of FIG. 3. The normalized, truncated extrinsic LLR value is also added to the soft value using adder 410 to generate a value P (i.e., $P=R_1+R_2+R_3+R_4+$ soft value) as shown in Equation (7). The hard-decision output value $\hat{x}_n$ may then be determined from P in a manner similar to that described above in relation to VNU 300 (i.e., using Equations (8) and (9)).

To generate messages $Q_1$, $Q_2$, $Q_3$, and $Q_4$, the soft value is multiplied by two (e.g., 414), which may be performed by shifting the soft value. The product (i.e., 2×soft value) is provided to (i) adder 416(0), which adds the product to the sum of messages $R_3$ and $R_4$ (i.e., $R_3+R_4+(2\times\text{soft value})$) and (ii) adder 416(1), which adds the product to the sum of messages $R_1$ and $R_2$ (i.e., $R_1+R_2+(2\times\text{soft value})$). The output of adder 416(0) is added to (i) converted message $R_2$ using adder 418(0) to generate message $Q_1$ (i.e., $Q_1=R_2+R_3+R_4+(2\times\text{soft value})$) and (ii) converted message $R_1$ using adder 418(1) to generate message $Q_2$ (i.e., $Q_2=R_1+R_3+R_4+(2\times\text{soft value})$). Similarly, the output of adder 416(1) is added to (i) converted message $R_4$ using adder 418(2) to generate message $Q_3$ (i.e., $Q_3=R_1+R_2+R_4+(2\times\text{soft value})$) and (ii) converted message $R_3$ using adder 418(3) to generate message $Q_4$ (i.e., $Q_4=R_1+R_2+R_3+(2\times\text{soft value})$). Messages $Q_1$, $Q_2$, $Q_3$, and $Q_4$ may then be normalized and truncated (e.g., 420(0), . . . , (3)), saturated (e.g., SAT 422(0), . . . , (3)), and converted from two's-complement format to sign-magnitude format (e.g., T2S 424(0), . . . , (3)) in a manner similar to that of the analogous processing of apparatus 300 of FIG. 3. Note that, since normalization (e.g., 420(0), . . . , (3)) (i.e., division by two) occurs after the soft-value is added to the R messages, the soft value is multiplied by two at multiplier 414. This is in contrast to VNU 300, in which normalization (i.e., 314(0), . . . , (3)) is performed before the soft value is added to the R messages.

The present invention may also be used for H-matrices other than H-matrix 100 of FIG. 1. For example, the present invention may be implemented for regular H-matrices that have a column hamming weight $w_c$ that is greater than or less than four. In such embodiments, the VNU may (i) receive greater than or less than four R messages and (ii) generate greater than or less than four Q messages. As an example, consider VNUs 500 and 600 of FIGS. 5 and 6, respectively, which may support column hamming weights $w_c$ of three and five, respectively.

Figure 5:
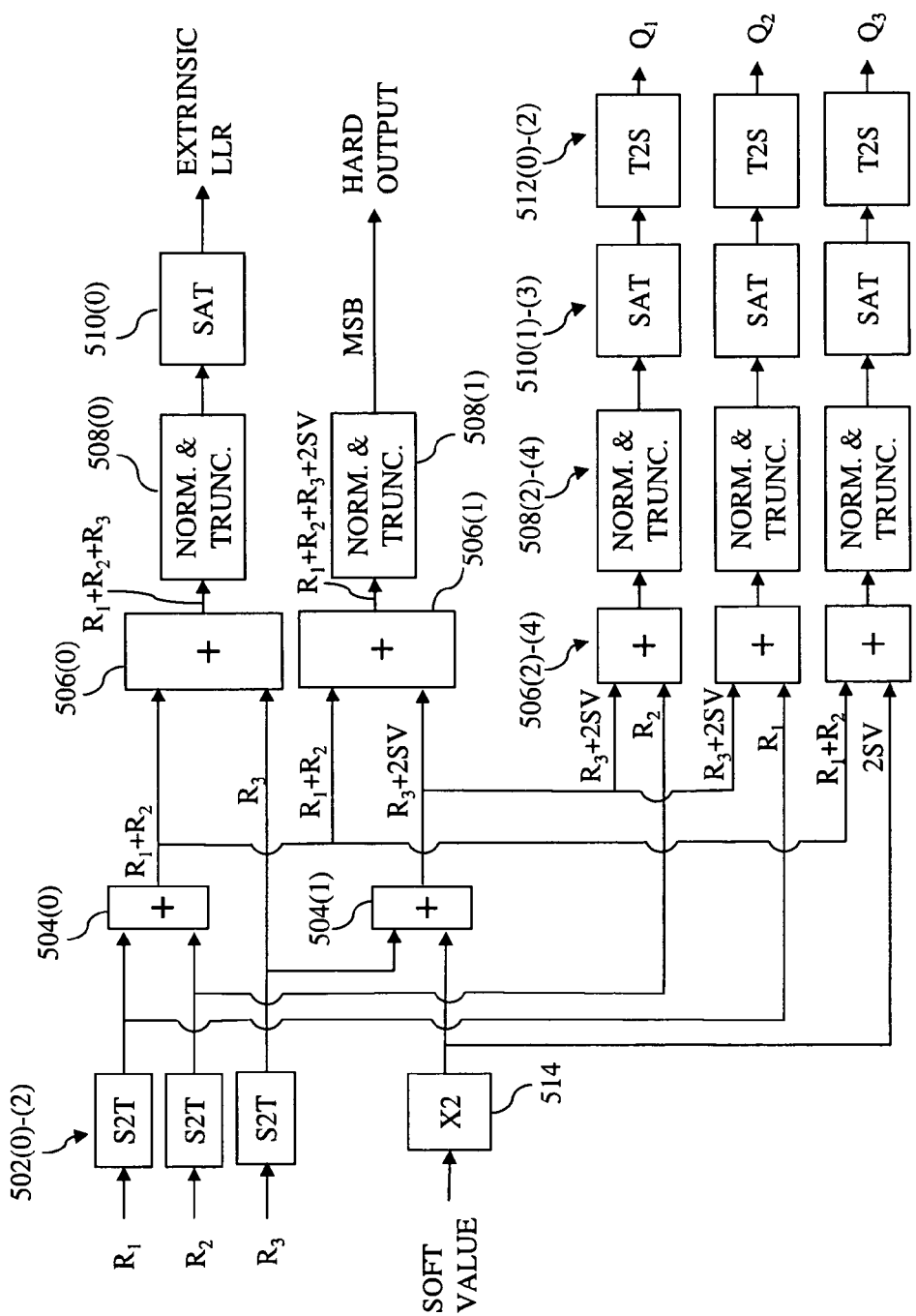
FIG. 5 shows a simplified block diagram of a VNU according to another embodiment of the present invention.

FIG. 5 shows a simplified block diagram of a VNU 500 according to another embodiment of the present invention. During each iteration, except for the initial iteration, VNU 500 (i) receives three R messages $R_1$, $R_2$, and $R_3$ and a soft value and (ii) generates three Q messages $Q_1$, $Q_2$, and $Q_3$, a hard output $\hat{x}_n$, and an extrinsic LLR value. The three Q messages, hard output $\hat{x}_n$, and extrinsic LLR value are generated using two adder stages, where the first adder stage comprises adders 504(0) and 504(1) and the second adder stage comprises adders 506(0), . . . , (4).

Messages $R_1$, $R_2$, and $R_3$ are converted from sign-magnitude format to two's-complement format (i.e., S2T 502(0), . . . , (2)) and the three converted R messages are added together using adders 504(0) and 506(0) to generate the extrinsic LLR value as shown in Equation (6). Adder 504(0) adds messages $R_1$ and $R_2$, and adder 506(0) adds the output of adder 504(0) (i.e., $R_1+R_2$) to message $R_3$ to generate the extrinsic LLR value (i.e., $R_1+R_2+R_3$). The extrinsic LLR value may be normalized and truncated (i.e., 508(0)) and saturated (SAT) (i.e., 510(0)) in a manner similar to that described above in relation to the analogous elements of VNU 300 of FIG. 3. To generate the hard-decision output value $\hat{x}_n$, the soft value is multiplied by two (e.g., 514) in a manner similar to that described above in relation to VNU 400 of FIG. 4. The product (i.e., 2×soft value) is provided adder 504(1), which adds the product to message $R_3$. The output of adder 504(1) (i.e., (2×soft value)+$R_3$) is added to the output of adder 504(0) (i.e., $R_1+R_2$) using adder 506(1) to generate a value P (i.e., P=$R_1$+$R_2+R_3$+(2×soft value)) as shown in Equation (7). The P value may be normalized and truncated (i.e., 508(1)), and the hard-decision output value $\hat{x}_n$ may be determined from P in a manner similar to that described above in relation to VNU 300 of FIG. 3 (i.e., using Equations (8) and (9)).

Messages $Q_1$, $Q_2$, and $Q_3$ are each generated by adding two R messages to the doubled soft value. In particular, adder 506(2) adds the output of adder 504(1) (i.e., (2×soft value)+$R_3$) to message $R_2$ to generate message $Q_1$ (i.e., $Q_1$=$R_2+R_3$+(2×soft value)), adder 506(3) adds the output of adder 504(1) (i.e., (2×soft value)+$R_3$) to message $R_1$ to generate message $Q_2$ (i.e., $Q_2$=$R_1+R_3$+(2×soft value)), and adder 506(4) adds the output of adder 504(0) (i.e., $R_1+R_2$) to the doubled soft value (i.e., 2×soft value) to generate message $Q_3$ (i.e., $Q_3$=$R_1+R_2$+(2×soft value)). Messages $Q_1$, $Q_2$, and $Q_3$ may then be normal and truncated (i.e., 508(2), ..., (4)), saturated (i.e., SAT 510(1), ..., (3)), and converted from two's-complement format to sign-magnitude format (i.e., T2S 512(0), ..., (2)) in a manner similar to that of the analogous processing of apparatus 300 of FIG. 3.

Figure 6:
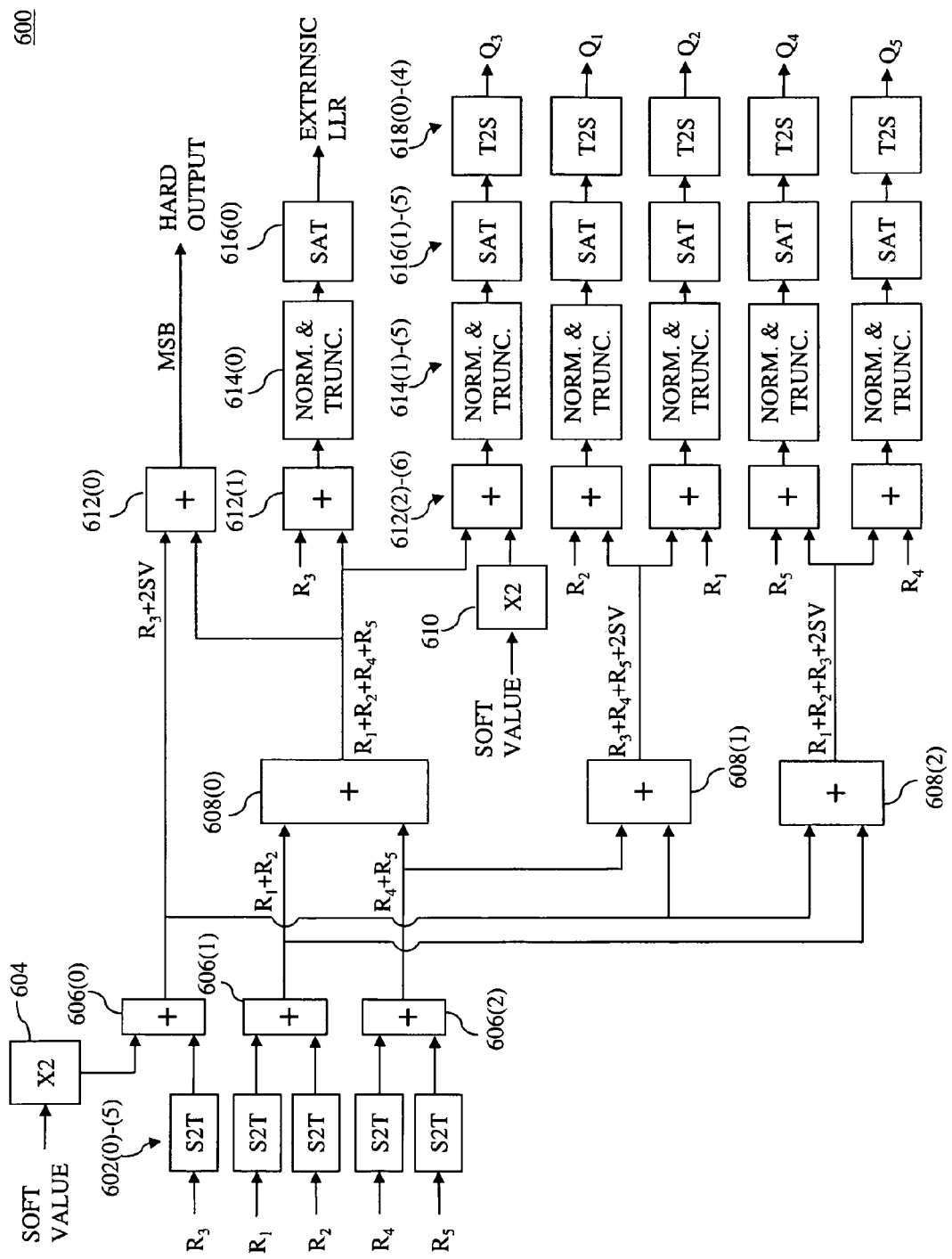
FIG. 6 shows a simplified block diagram of a VNU according to yet another embodiment of the present invention.

FIG. 6 shows a simplified block diagram of a VNU 600 according to yet another embodiment of the present invention. During each iteration, except for the initial iteration, VNU 600 (i) receives five R messages $R_1$, $R_2$, $R_3$, $R_4$, and $R_5$ and a soft value and (ii) generates five Q messages $Q_1$, $Q_2$, $Q_3$, $Q_4$, and $Q_5$, a hard output $\hat{x}_n$, and an extrinsic LLR value. The five Q messages, the hard output $\hat{x}_n$, and the extrinsic LLR value are generated using three adder stages, where the first adder stage comprises adders 606(0), ..., (2), the second adder stage comprises adders 608(0), ..., (2), and the third adder stage comprises adders 612(0), ..., (6).

Messages $R_1$, $R_2$, $R_3$, $R_4$, and $R_5$ are converted from sign-magnitude format to two's-complement format (i.e., S2T 602(0), ..., (5)) and the five converted R messages are added together using adders 606(1), 606(2), 608(0), and 612(1) to generate the extrinsic LLR value as shown in Equation (6). Adder 606(1) adds messages $R_1$ and $R_2$ (i.e., $R_1+R_2$) and adder 606(2) adds messages $R_4$ and $R_5$ (i.e., $R_4+R_5$). Adder 608(0) adds the outputs of adder 606(1) (i.e., $R_1+R_2$) and adder 606(2) (i.e., $R_4+R_5$), and adder 612(1) adds the output of adder 608(0) (i.e., $R_1+R_2+R_4+R_5$) to message $R_3$ to generate the extrinsic LLR value (i.e., $R_1+R_2+R_3+R_4+R_5$). The extrinsic LLR value may be normalized and truncated (i.e., 614(0)) and saturated (i.e., SAT 616(0)) in a manner similar to that described above in relation to the analogous elements of VNU 300 of FIG. 3. To generate the hard-decision output value $\hat{x}_n$, the soft value is multiplied by two (i.e., 604) in a manner similar to that described above in relation to VNU 400 of FIG. 4. The product (i.e., 2×soft value) is provided adder 606(0), which adds the product to message $R_3$. The output of adder 606(0) (i.e., $R_3$+(2×soft value)) is added to the output of adder 608(0) (i.e., $R_1+R_2+R_4+R_5$) to generate a value P (i.e., P=$R_1+R_2+R_3+R_4+R_5$+(2×soft value)) as shown in Equation (7). The hard-decision output value $\hat{x}_n$ may then be determined from P in a manner similar to that described above in relation to VNU 300 of FIG. 3 (i.e., using Equations (8) and (9)).

To generate messages $Q_1$, $Q_2$, $Q_3$, $Q_4$, and $Q_5$ adder 608(1) adds the output of adder 606(0) (i.e., $R_3$+2×soft value) and adder 606(2) (i.e., $R_4+R_5$), and adder 608(2) adds the output of adder 606(0) (i.e., $R_3$+2×soft value) and adder 606(1) (i.e., $R_1+R_2$). Messages $Q_1$, $Q_2$, $Q_3$, $Q_4$ are then generated using adders 612(2), ..., (6). Adder 612(2) adds the doubled soft value (i.e., 610) and the output of adder 608(0) (i.e., $R_1+R_2+R_4+R_5$) to generate message $Q_3$ (i.e., $R_1+R_2+R_4+R_5$+(2×soft value)). Adder 612(3) adds message $R_2$ to the output of adder 608(1) (i.e., $R_3+R_4+R_5$+(2×soft value)) to generate message $Q_1$ (i.e., $R_2+R_3+R_4+R_5$+(2×soft value)). Adder 612(4) adds message $R_1$ to the output of adder 608(1) (i.e., $R_3+R_4+R_5$+(2×soft value)) to generate message $Q_2$ (i.e., $R_1+R_3+R_4+R_5$+(2×soft value)). Adder 612(5) adds message $R_5$ to the output of adder 608(2) (i.e., $R_1+R_2+R_3$+(2×soft value)) to generate message $Q_4$ (i.e., $R_1+R_2+R_3+R_5$+(2×soft value)). Adder 612(6) adds message $R_4$ to the output of adder 608(2) (i.e., $R_1+R_2+R_3$+(2×soft value)) to generate message $Q_5$ (i.e., $R_1+R_2+R_3+R_4$+(2×soft value)). Messages $Q_1$, $Q_2$, $Q_3$, $Q_4$, and $Q_5$ may then be normalized and truncated (e.g., 614(1), ..., (5)), saturated (i.e., SAT 616(1), ..., (5)), and converted from two's-complement format to sign-magnitude format (i.e., T2S 618(0), ..., (4)) in a manner similar to that of the analogous processing of apparatus 300 of FIG. 3.

Figure 7:
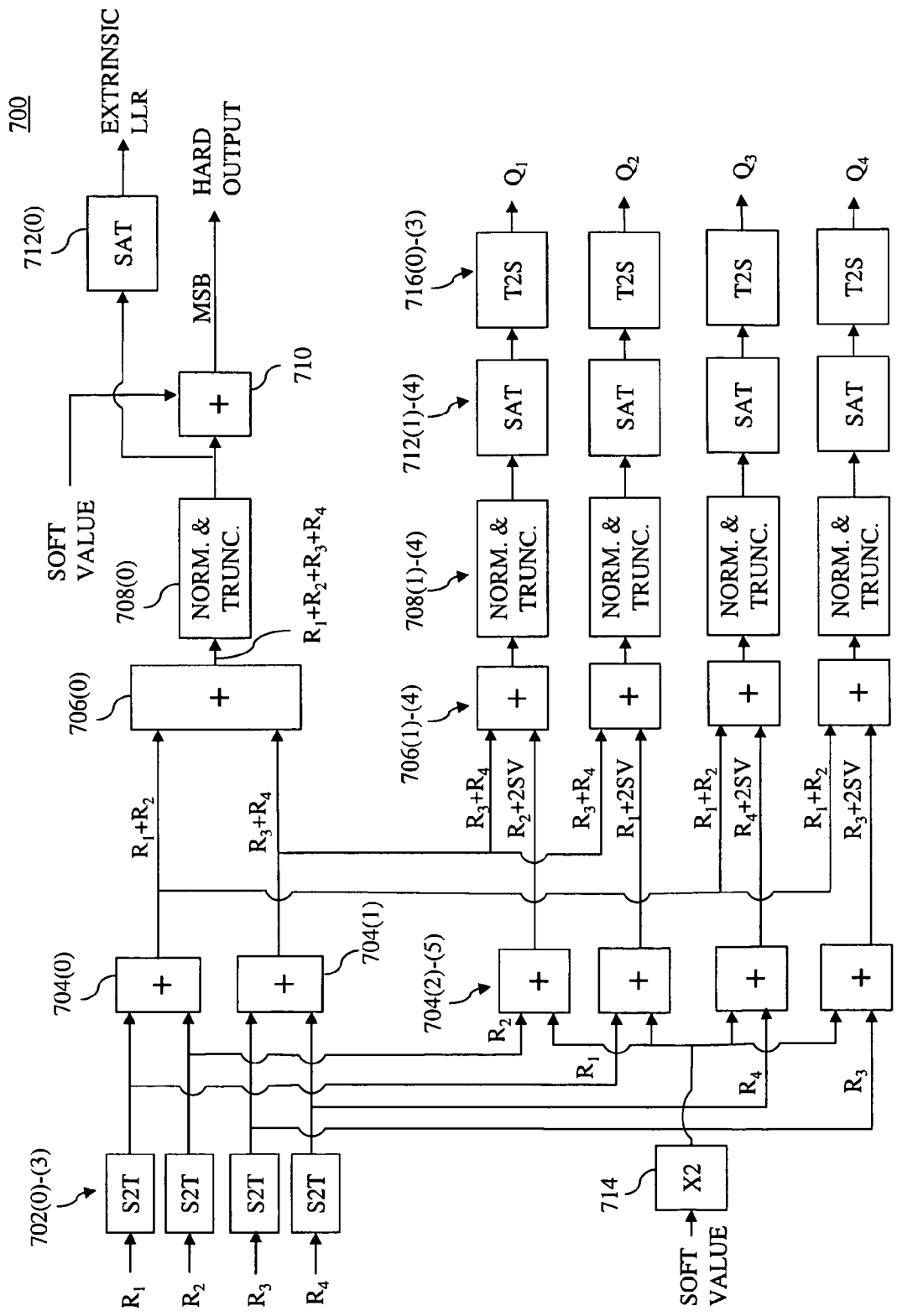
FIG. 7 shows a simplified block diagram of a VNU according to even yet another embodiment of the present invention.

FIG. 7 shows a simplified block diagram of a VNU 700 according to even yet another embodiment of the present invention. Similar to VNU 400, VNU 700 may generate four Q messages based on four R messages and a soft value; however, VNU 700 may generate the four Q messages in even fewer stages than VNU 400. During each iteration, except for the initial iteration, VNU 700 (i) receives four R messages $R_1$, $R_2$, $R_3$, and $R_4$ and a soft value and (ii) generates four Q messages $Q_1$, $Q_2$, $Q_3$, and $Q_4$, a hard output $\hat{x}_n$, and an extrinsic LLR value. The four Q messages and the extrinsic LLR are generated using two adder stages, where the first adder stage comprises adders 704(0), ..., (5) and the second adder stage comprises adders 706(0), ..., (4). The hard-decision output value $\hat{x}_n$ is generated using an additional (i.e., third) adder stage comprising adder 710.

Messages $R_1$, $R_2$, $R_3$, and $R_4$ are converted from sign-magnitude format to two's-complement format (i.e., S2T 702(0), ..., (3)), and the four converted R messages are added together using adders 704(0), 704(1), and 706(0) to generate the extrinsic LLR value as shown in Equation (6). Adder 704 adds messages $R_1$ and $R_2$ (i.e., $R_1+R_2$), adder 704(1) adds messages $R_3$ and $R_4$ (i.e., $R_3+R_4$), and adder 706(0) adds the outputs of adders 704(0) (i.e., $R_1+R_2$) and 704(1) (i.e., $R_3+R_4$) to generate the extrinsic LLR value (i.e., $R_1+R_2+R_3+R_4$). The extrinsic LLR value may be normalized and truncated (i.e., 708(0) and saturated (i.e., SAT 712(0))) in a manner similar to that described above in relation to the analogous elements of VNU 300 of FIG. 3. The normalized, truncated extrinsic LLR value is also added to the soft value using adder 710 to generate a value P (i.e., P=$R_1+R_2+R_3+R_4$+soft value) as shown in Equation (7). The hard-decision output value $\hat{x}_n$ may then be determined from P in a manner similar to that described above in relation to VNU 300 of FIG. 3 (i.e., using Equations (8) and (9)).

To generate messages $Q_1$, $Q_2$, $Q_3$, and $Q_4$, the soft value is multiplied by two (e.g., 714) in a manner similar to that described above in relation to VNU 400 of FIG. 4, and the product is added to messages $R_1$, $R_2$, $R_3$, and $R_4$ using adders 704(2), ..., (5), respectively. The output of adder 704(2) (i.e., $R_2$+(2×soft value)) is added to the output of adder 704(1) (i.e., $R_3+R_4$) using adder 706(1) to generate message $Q_1$ (i.e., $R_2+R_3+R_4$+(2×soft value)), the output of adder 704(3) (i.e., $R_1$+(2×soft value)) is added to the output of adder 704(1) (i.e., $R_3+R_4$) using adder 706(2) to generate message $Q_2$ (i.e., $R_1+R_3+R_4$+(2×soft value)), the output of adder 704(4) (i.e., $R_4$+(2×soft value)) is added to the output of adder 704(0) (i.e., $R_1+R_2$) using adder 706(3) to generate message $Q_3$ (i.e., $R_1+R_2+R_4$+(2×soft value)), and the output of adder 704(5)

(i.e., $R_3$+(2×soft value)) is added to the output of adder 704(0) (i.e., $R_1$+$R_2$) using adder 706(4) to generate message $Q_4$ (i.e., $R_1$+$R_2$+$R_3$+(2×soft value)). Messages $Q_1$, $Q_2$, $Q_3$, and $Q_4$ may then be normalized and truncated (e.g., 708(1), ..., (4)), saturated (e.g., SAT 712(1), ..., (4)), and converted from two's-complement format to sign-magnitude format (e.g., T2S 716(0), ..., (3)) in a manner similar to that of the analogous processing of apparatus 300 of FIG. 3.

By adding only the R messages that are needed to generate each Q message, rather than adding all of the R messages together and subtracting an R message from the total to generate each Q message, VNUs of the present invention may be implemented using fewer adder stages than prior-art VNUs. In particular, VNUs of the present invention may be implemented for H-matrices having a column hamming weight of $w_c$ using ceil($\log_2(w_c+1)$) or fewer adder stages, where the ceiling function ceil($w_c+1$) represents the integer value that is equal to or just exceeds ($w_c+1$). Prior-art VNUs on the other hand, may be implemented using greater than ceil($\log_2(w_c+1)$) adder stages. By using fewer adder stages, VNUs of the present invention may generate the Q messages in a shorter amount of time than prior-art VNUs. As a result, the throughput of VNUs of the present invention may be greater than the throughput of prior-art VNUs, and the throughput of LDPC decoders that implement VNUs of the present invention may be greater than the throughput of prior-art LDPC decoders that implement prior-art VNUs, which are often limited by the throughput of the prior-art VNUs.

The present invention may be implemented for various H-matrices that are the same size or a different size than H-matrix 100 of FIG. 1. For example, the present invention may be implemented for H-matrices in which the number of columns, block columns, rows, block rows, and the column and row hamming weights differ from that of H-matrix 100. In such embodiments, the number of VNUs, barrel shifters, and CNUs may vary according to the size of the H-matrix.

While the present invention was described relative to its use with regular H-matrices, the present invention is not so limited. The present invention may also be implemented for H-matrices that are not regular. For example, suppose that an LDPC decoder of the present invention supports an irregular H-matrix in which the hamming weight $w_c$ of some of the columns is four and the hamming weight of other columns is five. Such an LDPC decoder may be implemented using (i) a plurality of VNUs such as VNU 400 of FIG. 4, where each such VNU corresponds to a column having a hamming weight $w_c$ of four, and (ii) a plurality of VNUs such as VNU 600 of FIG. 6, where each such VNU corresponds to a column having a hamming weight $w_c$ of five.

Further, the present invention is not limited to use with quasi-cyclic H-matrices. VNUs and LDPC decoders of the present invention may be used with H-matrices that are either partially quasi-cyclic or fully non-quasi-cyclic. Partially quasi-cyclic LDPC codes are LDPC codes that comprise (i) one or more cyclic sub-matrices that are either equal to an identity matrix or are obtained by cyclically shifting an identity matrix and (ii) one or more non-cyclic sub-matrices that are not equal to an identity matrix and can not be obtained by cyclically shifting an identity matrix. LDPC codes that are fully non-quasi-cyclic do not have any cyclic sub-matrices. In various embodiments that employ either partially quasi-cyclic or fully non-quasi-cyclic H-matrices, the VNUs and check node units (CNUs) may be interconnected using, for example, fixed connections or fully programmable cross-bars in lieu of barrel shifters.

Figure 2:
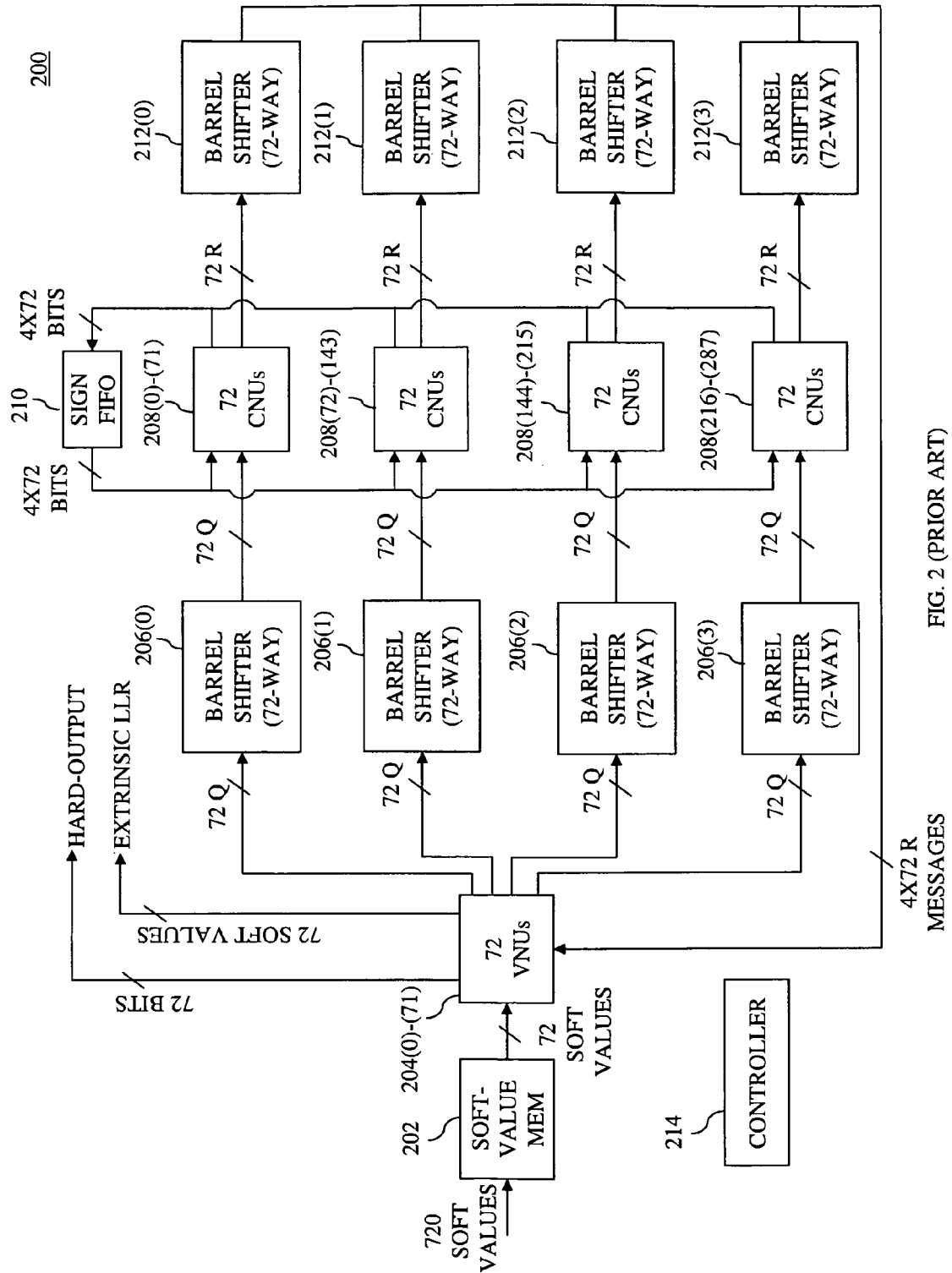
FIG. 2 shows a simplified block diagram of one implementation of a prior-art LDPC decoder that may be used to decode a signal encoded using an H-matrix such as the H-matrix of FIG. 1.

Yet further, the present invention is not limited to use with the non-layered LDPC decoder configuration of FIG. 2. VNUs of the present invention may be used with other non-layered LDPC decoder configurations and may also be used with various layered LDPC decoder configurations.

While VNUs of the present invention were discussed as receiving R messages and outputting Q messages using sign-magnitude format, the present invention is not so limited. VNUs may receive R messages and output Q messages in another format, such as two's-complement format. The particular format may be chosen based on, for example, the format that is used by the CNUs to generate R messages. Further, the present invention is not limited to adding R messages using two's-complement format. The R messages may be added using another format, such as sign-magnitude format. Note that the hardware implementation of addition using two's complement format may be less complex than the hardware implementation of addition using sign-magnitude format.

The present invention was discussed as implementing normalization, truncation, and saturation to ensure that the number b of bits used to represent each R message and each Q message remains constant and to ensure that the Q messages are maintained within a specified range. However, the present invention is not so limited. Various embodiments of the present invention may be envisioned in which the number b of bits used to represent each R message and each Q message is not constant. Further, various embodiments may be envisioned in which the Q messages are not maintained within a specified range.

The present invention is also not limited to receiving and processing log-likelihood ratios. Various embodiments of the present invention may be envisioned in which other soft values, such as likelihood ratios, or hard bit decisions are processed.

The present invention may be implemented as circuit-based processes, including possible implementation as a single integrated circuit (such as an ASIC or an FPGA), a multi-chip module, a single card, or a multi-card circuit pack. As would be apparent to one skilled in the art, various functions of circuit elements may also be implemented as processing blocks in a software program. Such software may be employed in, for example, a digital signal processor, microcontroller, or general-purpose computer.

The present invention can be embodied in the form of methods and apparatuses for practicing those methods. The present invention can also be embodied in the form of program code embodied in tangible media, such as magnetic recording media, optical recording media, solid state memory, floppy diskettes, CD-ROMs, hard drives, or any other machine-readable storage medium, wherein, when the program code is loaded into and executed by a machine, such as a computer, the machine becomes an apparatus for practicing the invention. The present invention can also be embodied in the form of program code, for example, whether stored in a storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits. The present invention can also be embodied in the form of a bitstream or other sequence of signal values electrically or optically transmitted through a medium, stored magnetic-field variations in a magnetic recording medium, etc., generated using a method and/or an apparatus of the present invention.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

I claim:

1. In a low-density parity-check (LDPC) decoder having at least one variable node unit (VNU), a method for generating a plurality of variable node messages by the VNU, the method comprising:
    (a) receiving a set of three or more check node messages; and
    (b) generating each of the plurality of variable node messages by summing a different subset of the set of check node messages, wherein:
        each different subset of the check node messages excludes a different check node message of the set; and
        each variable node message is generated without subtracting the corresponding different check node message from a value corresponding to a sum of all of the check node messages.

2. The invention of claim 1, wherein:
step (a) further comprises receiving a soft-input value; and
in step (b), generating each of the plurality of variable node messages is further based on the soft-input value.

3. The invention of claim 2, wherein step (b) further comprises:
    (b1) doubling the soft-input value to generate a doubled soft-input value;
    (b2) generating each variable node message by adding in the doubled soft-input value; and
    (b3) applying normalization and truncation to each variable node message.

4. The invention of claim 3, wherein:
step (a) comprises receiving first, second, third, and fourth check node messages; and
step (b) is performed using first, second, and third adder stages, wherein:
    the first adder stage (i) sums the first and second check node messages to generate a first partial sum and (ii) sums the third and fourth check node messages to generate a second partial sum;
    the second adder stage (i) sums the first partial sum and the doubled soft-input value to generate a third partial sum and (ii) sums the second partial sum and the doubled soft-input value to generate a fourth partial sum; and
    the third adder stage (i) sums the fourth partial sum and the second check node message to generate a first variable node message, (ii) sums the fourth partial sum and the first check node message to generate a second variable node message, (iii) sums the third partial sum and the fourth check node message to generate a third variable node message, and (iv) sums the third partial sum and the third check node message to generate a fourth variable node message.

5. The invention of claim 3, wherein:
step (a) comprises receiving first, second, third, and fourth check node messages; and
step (b) is performed using first and second adder stages, wherein:
    the first adder stage (i) sums the first and second check node messages to generate a first partial sum, (ii) sums the third and fourth check node messages to generate a second partial sum, (iii) sums the first check node message and the doubled soft value to generate a third partial sum, (iv) sums the second check node message and the doubled soft value to generate a fourth partial sum, (v) sums the third check node message and the doubled soft value to generate a fifth partial sum, and (vi) sums the fourth check node message and the doubled soft value to generate a sixth partial sum; and
    the second adder stage (i) sums the second partial sum and the fourth partial sum to generate the first variable node message, (ii) sums the second partial sum and the third partial sum to generate the second variable node message, (iii) sums the first partial sum and the sixth partial sum to generate the third variable node message, and (iv) sums the first partial sum and the fifth partial sum to generate the fourth variable node message.

6. The invention of claim 1, wherein:
decoding by the LDPC decoder is based on an LDPC code;
the plurality of variable node messages corresponds to a column of the LDPC code having a hamming weight $w_c$; and
$w_c$ variable node messages are generated using a plurality of adder stages, wherein the plurality of adder stages has no more than $\mathrm{ceil}(\log_2(w_c+1))$ adder stages.

7. The invention of claim 6, wherein:
$w_c$ equals four; and
four variable node messages are generated using three adder stages.

8. The invention of claim 6, wherein:
$w_c$ equals four; and
four variable node messages are generated using two adder stages.

9. A low-density parity-check (LDPC) decoder having at least one variable node unit (VNU), wherein the VNU comprises:
    a plurality of adder stages adapted to receive a set of three or more check node messages and generate each of a plurality of variable node messages by summing a different subset of the set of check node messages, wherein:

each different subset of the check node messages excludes a different check node message of the set; and the VNU is adapted to generate each variable node message without subtracting the corresponding different check node message from a value corresponding to a sum of all of the check node messages.

10. The invention of claim 9, wherein:
the VNU is adapted to receive a soft-input value; and
the plurality of adder stages is adapted to generate each of the plurality of variable node messages based on the soft-input value.

11. The invention of claim 10, wherein:
the VNU is further adapted to double the soft-input value to generate a doubled soft-input value;
the plurality of adder stages is adapted to generate each variable node message by adding in the doubled soft-input; and
the VNU is further adapted to apply normalization and truncation to each variable node message.

12. The invention of claim 11, wherein:
the plurality of adder stages receives first, second, third, and fourth check node messages; and
the plurality of adder stages comprises first, second, and third adder stages, wherein:
the first adder stage (i) sums the first and second check node messages to generate a first partial sum and (ii) sums the third and fourth check node messages to generate a second partial sum;
the second adder stage (i) sums the first partial sum and the doubled soft-input value to generate a third partial sum and (ii) sums the second partial sum and the doubled soft-input value to generate a fourth partial sum; and
the third adder stage (i) sums the fourth partial sum and the second check node message to generate a first variable node message, (ii) sums the fourth partial sum and the first check node message to generate a second variable node message, (iii) sums the third partial sum and the fourth check node message to generate a third variable node message, and (iv) sums the third partial sum and the third check node message to generate a fourth variable node message.

13. The invention of claim 11, wherein:
the plurality of adder stages receives first, second, third, and fourth check node messages; and
the plurality of adder stages comprises first and second adder stages, wherein:
the first adder stage (i) sums the first and second check node messages to generate a first partial sum, (ii) sums the third and fourth check node messages to generate a second partial sum, (iii) sums the first check node message and the doubled soft value to generate a third partial sum, (iv) sums the second check node message and the doubled soft value to generate a fourth partial sum, (v) sums the third check node message and the doubled soft value to generate a fifth partial sum, and (vi) sums the fourth check node message and the doubled soft value to generate a sixth partial sum; and the second adder stage (i) sums the second partial sum and the fourth partial sum to generate the first variable node message, (ii) sums the second partial sum and the third partial sum to generate the second variable node message, (iii) sums the first partial sum and the sixth partial sum to generate the third variable node message, and (iv) sums the first partial sum and the fifth partial sum to generate the fourth variable node message.

14. The invention of claim 9, wherein:
decoding by the LDPC decoder is based on an LDPC code;
the plurality of variable node messages corresponds to a column of the LDPC code having a hamming weight $w_c$; and
$w_c$ variable node messages are generated using the plurality of adder stages, wherein the plurality of adder stages has no more than $\text{ceil}(\log_2(w_c+1))$ adder stages.

15. The invention of claim 14, wherein:
$w_c$ equals four; and
four variable node messages are generated using three adder stages.

16. The invention of claim 14, wherein:
$w_c$ equals four; and
four variable node messages are generated using two adder stages.

17. A low-density parity-check (LDPC) decoder having at least one variable node unit (VNU), the VNU comprising:
(a) means for receiving a set of three or more check node messages; and
(b) means for generating each of a plurality of variable node messages by summing a different subset of the set of check node messages, wherein:
each different subset of the check node messages excludes a different check node message of the set; and
each variable node message is generated without subtracting the corresponding different check node message from a value corresponding to a sum of all of the check node messages.

* * * * *